United States Patent
Yoo

(10) Patent No.: US 6,911,676 B2
(45) Date of Patent: Jun. 28, 2005

(54) SEMICONDUCTOR LED DEVICE AND METHOD FOR MANUFACTURING THE SAME

(75) Inventor: Tae-Kyung Yoo, Yongin-Si (KR)

(73) Assignees: Epivalley Co., Ltd., Gyounggi-do (KR); Samsung Electro-Mechanics Co., Ltd., Kyungki-do (KR)

(*) Notice: Subject to any disclaimer, the term of this patent is extended or adjusted under 35 U.S.C. 154(b) by 58 days.

(21) Appl. No.: 10/444,993

(22) Filed: May 27, 2003

(65) Prior Publication Data

US 2004/0012033 A1 Jan. 22, 2004

(30) Foreign Application Priority Data

Jul. 18, 2002 (KR) .................... 10-2002-0042241

(51) Int. Cl.[7] ............................................. H01L 33/00
(52) U.S. Cl. ........................... 257/93; 257/80; 257/84
(58) Field of Search .................... 257/80–85, 93, 257/103

(56) References Cited

U.S. PATENT DOCUMENTS

| | | | |
|---|---|---|---|
| 6,054,716 A | | 4/2000 | Sonobe |
| 2002/0028527 A1 | * | 3/2002 | Maeda et al. .......... 438/29 |

FOREIGN PATENT DOCUMENTS

| | | |
|---|---|---|
| JP | 10-256610 | 9/1998 |
| KR | 010088929 | 9/2001 |

* cited by examiner

*Primary Examiner*—Minh-Loan Tran
(74) *Attorney, Agent, or Firm*—Blackwell Sanders Peper Martin LLP

(57) ABSTRACT

A semiconductor LED device in which a reverse p-n junction diode protective element is integrated with a single p-n junction AlGaInN semiconductor LED element having a conventional structure, so that the semiconductor LED device exhibits high resistance to reverse voltage. In accordance with the function of the reverse p-n junction diode protective element, the p-n junction LED element can be securely protected from external static electricity and momentary reverse overvoltage applied thereto. In particular, it is possible to basically eliminate causes of a p-n junction breakage occurring in an LED element due to application of a reverse voltage frequently occurring during a process of the LED element, thereby greatly improving the reliability and yield of the LED element. The p-n junction LED element and the reverse p-n junction diode protective element are integrated with each other on the same substrate such that electrical connection is provided between the p-electrode of the LED element and the n-electrode of the protective element and between the n-electrode of the LED element and the p-electrode of the protective element in accordance with a semiconductor process.

2 Claims, 3 Drawing Sheets

Prior Art

SEMICONDUCTOR LED DEVICE AND METHOD FOR MANUFACTURING THE SAME

BACKGROUND OF THE INVENTION

1. Field of the Invention

The present invention relates to an AlGaInN-based semiconductor LED device, and a method for manufacturing the same. In particular, the present invention relates to means for basically solving problems caused by application of reverse voltage involved with conventional AlGaInN-based semiconductor LED element having a single p-n junction.

2. Description of the Related Art

Conventional p-n junction LED elements may be broken due to momentary reverse voltage or static electricity externally applied thereto or involve potential defects caused by non-specific static electricity because its breakdown voltage (Vr) against reverse voltage is low, for example, several ten volts. For this reason, such conventional p-n junction LED elements exhibit degraded reliability.

In order to solve this problem, the present invention is adapted to integrate an LED element with a reverse p-n junction protective element, so as to prevent reverse voltage applied to the LED element from flowing through the LED element while operating the protective element to absorb the reverse voltage, thereby protecting the LED element from damage caused by the reverse voltage.

Referring to FIG. 1, a conventional AlGaInN-based LED element is illustrated. As shown in FIG. 1, the LED element includes a sapphire substrate 10 as an insulating substrate. The LED element also includes, a buffer layer 11, an n type GaN layer 12, an InGaN (or GaN) active layer 13, a p type GaN layer 14, a transparent electrode 15, a protective film 16, an n type metal electrode 17, and a p type metal electrode 18, which are laminated on the sapphire substrate 10.

This structure is a p-n junction diode structure in which holes introduced into an active layer through a p-electrode are coupled, in the active layer, with electrons introduced into the active layer through an n-electrode, thereby emitting light corresponding to a band gap of the composition of the active layer material in accordance with the principle of a general compound semiconductor optical element. In accordance with electrical characteristics of a general p-n junction LED element, current flows through the LED element at the level of a threshold voltage Vth when a forward voltage is applied to the LED element. On the other hand, when a reverse voltage is applied to the LED element, no or little current flows through the LED element until the applied voltage reaches the level of a breakdown voltage −Vr. When the applied voltage exceeds the breakdown voltage −Vr, current flows sharply (FIG. 2). Such a breakdown voltage −Vr is determined by the doping concentration and crystallinity of the p-n junction. In the case of an AlGaInN-based LED, its breakdown voltage is typically several ten volts (10 to 50V). When the p-n junction in such an LED has an increased doping concentration to maintain the operating voltage of the LED to be low, the breakdown voltage of the LED may be decreased to, for example, a range of 10 to 20V. In this case, however, the LED may be susceptible to external static electricity, so that it may be broken. Otherwise, the p-n junction of the LED may be damaged, so that the reliability of the LED may be gradually degraded. In particular, since static electricity is frequently generated during a process of assembling the element, reverse voltage applied to the LED has great influence on the reliability and yield of the element. For this reason, application of reverse voltage is an important problem to be handled.

SUMMARY OF THE INVENTION

Therefore, the present invention has been made in view of the above mentioned problems, and an object of the invention is to provide a semiconductor LED device having a configuration including an LED element, and a protective element integrated with the LED element, and adapted to bypass a reverse voltage applied to the LED element, thereby protecting the LED element.

In accordance with the present invention, this object is accomplished by providing a semiconductor LED device comprising: an AlGaInN-based LED element formed on an insulating substrate; and at least one reverse p-n diode protective element formed on the insulating substrate while being arranged adjacent to the LED element, the protective element being electrically connected at an n-electrode thereof with a p-electrode of the LED element, and at a p-electrode thereof with an n-electrode of the LED element.

In the semiconductor LED device of the present invention, it is possible to basically prevent breakage of its element caused by external static electricity or momentary reverse voltage, thereby achieving an optimum handling efficiency and package yield while achieving an improvement in reliability.

BRIEF DESCRIPTION OF THE DRAWINGS

The above objects, and other features and advantages of the present invention will become more apparent after a reading of the following detailed description when taken in conjunction with the drawings, in which:

FIG. 3b is a cross-sectional view taken along the line A–A' of FIG. 3a;

DESCRIPTION OF THE PREFERRED EMBODIMENTS

Figure 1:
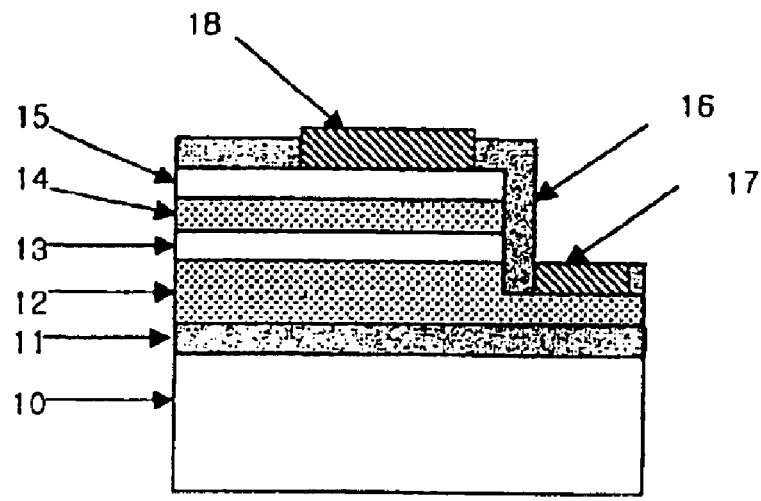
FIG. 1 is a sectional view illustrating a conventional AlGaInN-based LED element.
Figure 2:
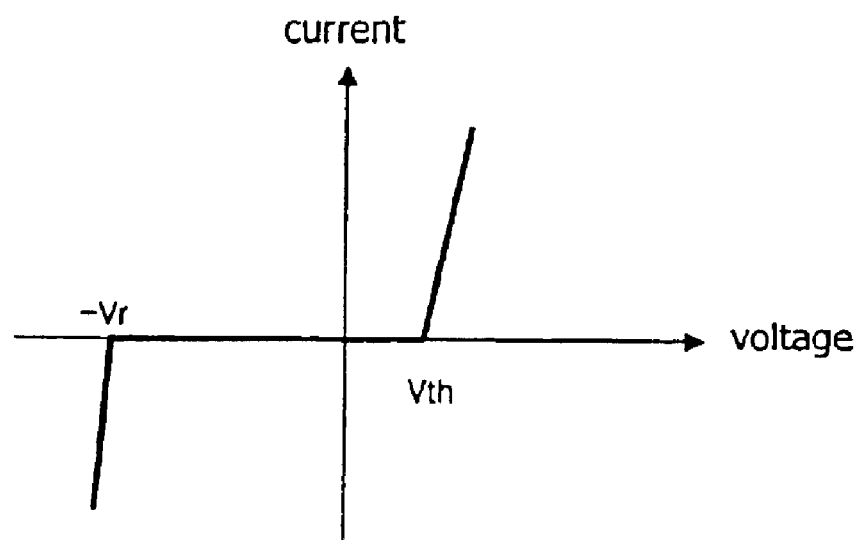
FIG. 2 is a voltage-current characteristic curve of an LED device according to the present invention.
Figure 3A:
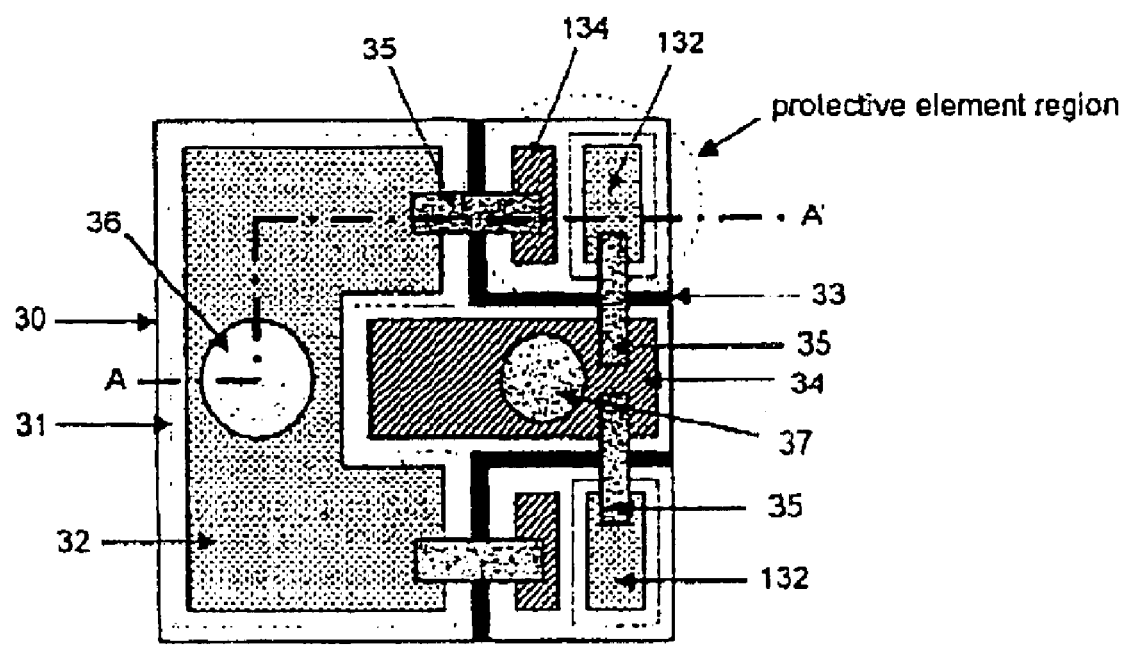
FIG. 3a is a plan view illustrating the layout of the LED device according to the present invention.
Figure 3B:
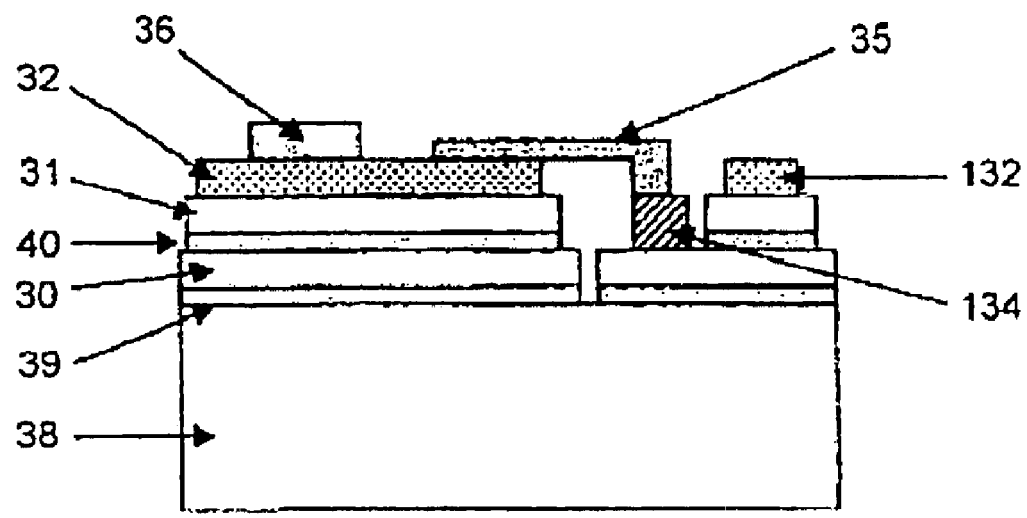

Referring to FIGS. 3a and 3b, a semiconductor LED device according to the present invention is illustrated. In accordance with the present invention, the semiconductor LED device includes a structure in which an LED element and a reverse p-n junction diode protective element are integrated with each other on the same substrate in such a fashion that they are electrically isolated from each other. After the integration of the LED element and protective element in an isolated state, a desired electrode connection is provided between the LED element and the protective element by connecting the anode of the LED element to the cathode of the protective element while connecting the cathode of the LED element to the anode of the protective element, as shown in FIGS. 3a and 3b.

A preferred embodiment of the present invention will be described in detail with reference to the annexed drawings.

In accordance with a preferred embodiment of the present invention, an appropriate buffer layer 39 is grown over an insulating substrate 38, as shown in FIG. 3b. An n-AlGaInN layer 30 is then grown over the buffer layer 39. Subsequently, an active layer 40 having a multi-layer structure of $Al_{(X)}Ga_{(Y)}In_{(Z)}N/Al_{(X1)}Ga_{(Y1)}In_{(Z1)}N$ is grown over the n-AlGaInN layer 30. A p-AlGaInN layer 31 is then grown over the active layer 40. The composition of the active layer 40 satisfies conditions of x+y+z=1 and x1+y1+z1=1.

Figure 4:
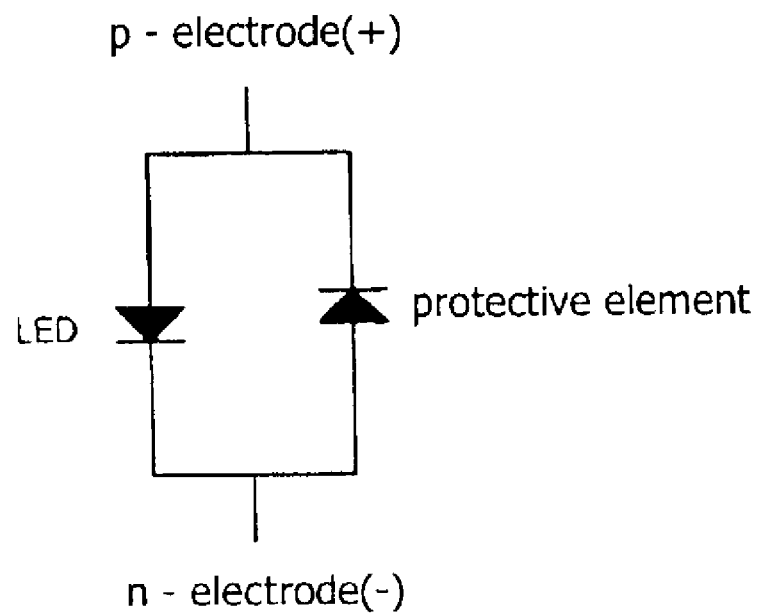
FIG. 4 is a circuit diagram illustrating the electrical circuit concept of the LED device according to the present invention.

In order to form an LED element and a protective element isolated from each other, all crystalline layers grown over the insulating substrate 38 are subjected to an etching process so that they are removed from a region 33. After the isolation process, formation of respective n-electrodes 34, 134 for the LED element and protective element is carried out by etching, at an n-electrode region, the entire portion of the p-AlFaInN layer 31 and the entire portion of the $Al_{(x)}Ga_{(y)}In_{(z)}N/Al_{(X1)}Ga_{(y1)}In_{(Z1)}N$ active layer 40, while etching, at the n-electrode region, an upper portion of the n-AlGaInN layer 30, thereby partially exposing the n-AlGaInN layer 30, and forming an n-electrode metal on the exposed portion of the n-AlGaInN layer 30. Thus, the LED element and the protective element, which have the same structure while being electrically insulated from each other, are obtained. The protective element may have a reverse p-n junction diode structure. Thereafter, an electrical connection is made between the LED element and the protective element by connecting the p-electrode 32 of the LED element to the n-electrode 34 of the protective element while connecting the n-electrode 34 of the LED element to the p-electrode 132 of the protective element, using a metal wiring 35. Thus, a circuit is obtained in which the LED element and protective elements are electrically connected at opposite polarities thereof. FIG. 4 shows a diagram of the circuit in which the opposite polarities of the LED element and protective element are electrically connected.

Another protective element can be provided as shown in FIG. 3. Numerals 33, 36, 37 indicate an etched region for electrically isolating the LED element from the protective element, a p type metal electrode, and an n type metal electrode, respectively.

Figure 5:
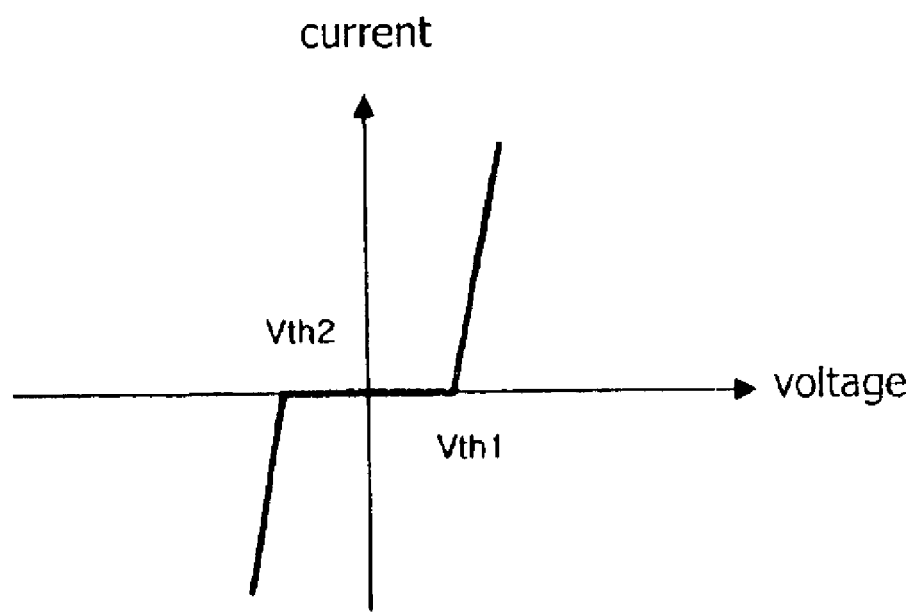
FIG. 5 is a current-voltage characteristic curve according to the present invention.

FIG. 5 shows the operation principle of the device having the above described configuration. When a forward voltage is applied to the device with reference to the LED element, this LED element operates normally. At this time, the protective element does not operate because the direction of the applied voltage is a reverse direction with reference to the protective element. In this case, the reverse breakdown voltage Vr of the protective element should be sufficiently higher than the forward threshold voltage Vth1 of the LED element. Accordingly, the device operates as if there is no protective element when a normal forward voltage is applied.

When a reverse voltage or a reverse voltage of static electricity is momentarily applied to the device, the LED element is reversely biased, so that it resists the reverse voltage until the reverse voltage reaches the level of the breakdown voltage. In this case, the protective element operates before the reverse voltage reaches the breakdown voltage of the LED element, that is, at a voltage Vth2 lower than the breakdown voltage. Since the reverse voltage is applied to the protective element as a forward voltage, the protective element turns on at its threshold voltage (this voltage is much lower than the breakdown voltage of the LED element), so that it is forwardly biased. Accordingly, the LED element is fully protected because no reverse voltage higher than the threshold voltage of the protective element is applied to the LED element.

As apparent from the above description, the present invention provides a structure capable of basically eliminating causes of a p-n junction breakage occurring in an LED element due to application of a reverse voltage while adversely affecting the reliability and yield of the LED element. In accordance with this structure, it is possible to protect the LED element from being broken due to static electricity or reverse overvoltage, while preventing the LED element from being damaged due to unknown factors, thereby greatly improving the reliability and yield of the LED element. Furthermore, it is possible to protect the LED element in an environment in which the reverse voltage applied to the LED element may exceed the breakdown voltage of the LED element.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor LED device comprising:
    an AlGaInN-based LED element formed on an insulating substrate; and
    a reverse p-n diode protective element formed on the insulating substrate while being arranged adjacent to the LED element, the protective element being electrically connected at an n-electrode thereof with a p-electrode of the LED element, and at a p-electrode thereof with an n-electrode of the LED element, the protective element being grown on the insulating substrate together with the LED element and being isolated from the LED element by etching.

2. The semiconductor LED device according to claim 1, wherein the LED element has a breakdown voltage higher than the threshold voltage of the protective element.

* * * * *